United States Patent [19]

Yanagisawa

[11] Patent Number: 4,759,610

[45] Date of Patent: Jul. 26, 1988

[54] ACTIVE MATRIX DISPLAY WITH CAPACITIVE LIGHT SHIELD

[75] Inventor: Toshio Yanagisawa, Tokyo, Japan

[73] Assignee: Kabushiki Kaisha Toshiba, Kawasaki, Japan

[21] Appl. No.: 913,560

[22] Filed: Sep. 29, 1986

Related U.S. Application Data

[63] Continuation of Ser. No. 641,775, Aug. 17, 1984, abandoned.

[30] Foreign Application Priority Data

Aug. 23, 1983 [JP] Japan .................................. 58-153771

[51] Int. Cl.[4] ........................ G02F 1/133; H01L 29/78
[52] U.S. Cl. .................................... 350/334; 357/23.7; 357/30
[58] Field of Search .................... 350/334, 339 F, 345; 357/30 L, 23.7

[56] References Cited

U.S. PATENT DOCUMENTS

| 3,824,003 | 7/1974 | Koda et al. | 350/334 |
| 3,840,695 | 10/1974 | Fischer | 350/334 X |
| 4,040,073 | 8/1977 | Luo | 350/334 X |
| 4,158,484 | 6/1979 | Nishiyama | 350/338 |
| 4,196,973 | 4/1980 | Hochstrate | 350/345 |
| 4,239,346 | 7/1980 | Lloyd | 350/334 |
| 4,431,271 | 2/1984 | Okubo | 350/334 |
| 4,470,667 | 9/1984 | Okubo et al. | 350/334 |
| 4,545,112 | 10/1985 | Holmberg et al. | 357/23.7 |

FOREIGN PATENT DOCUMENTS

| 2902303 | 7/1979 | Fed. Rep. of Germany | 357/23.7 |
| 0159516 | 9/1983 | Japan | 350/334 |

OTHER PUBLICATIONS

Fang, "TFT Structure With Electrically Adjustable Threshold IBM Technical Disclosure, vol. 20, No. 12, May 1978, p. 5352.
Luo et al. II, "A Low-Leakage-Current Thin-Film Transistor for Flat-Panel Displays" 1980 Biennial Display Research Conference, IEEE, Oct. 1980.
Electron & Applic. Industr., No. 254, Jun. 1978, pp. 15-16 by F. Morin: "Des Transistors En Couches Minces Pour Les Ecrans de Visualization".

Primary Examiner—Stanley D. Miller
Assistant Examiner—David Lewis
Attorney, Agent, or Firm—Cushman, Darby & Cushman

[57] ABSTRACT

In an active matrix type display apparatus which includes a first electrode substrate having a transparent insulation substrate on which a thin film transistor a transparent display pixel electrode selectively driven by the thin file transistor and a connecting portion for connecting the thin film transistor with the transparent display pixel electrode are formed, a second electrode substrate having another transparent insulation substrate on which an opposing electrode formed of a transparent conductive film is formed, and a display medium sandwiched between the first and second electrode substrates, an electrically conductive light shielding layer which is fixed at a predetermined potential is provided on each of thin film transistor portions of the first electrode substrate, and a part of the light shielding layer opposes a part of the transparent display pixel electrode through an insulation film so as to form a supplemental storage capacitor.

8 Claims, 4 Drawing Sheets

F I G. 6
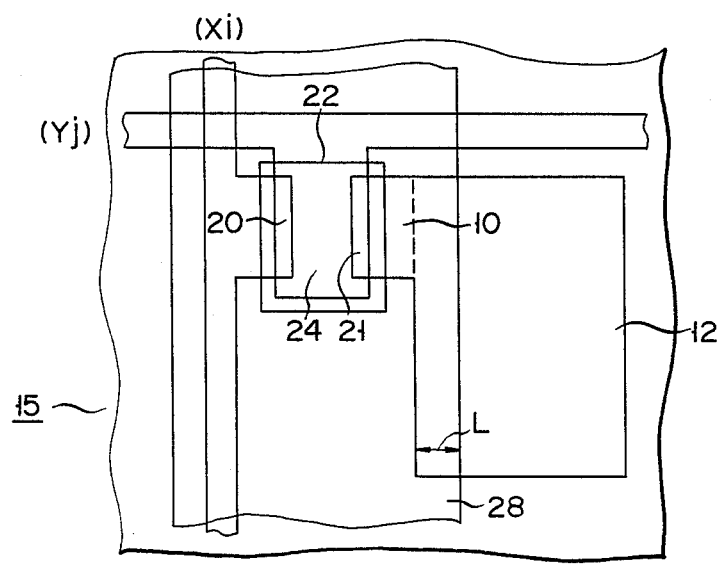

ACTIVE MATRIX DISPLAY WITH CAPACITIVE LIGHT SHIELD

This is a continuation of application Ser. No. 641,775, filed Aug. 17, 1984, which was abandoned upon the filing hereof.

BACKGROUND OF THE INVENTION

1. Field of the Invention

The present invention relates to an active matrix type display apparatus of transmission type using a thin film transistor (TFT) array.

2. Description of the Prior Art

Currently, a display apparatus using a liquid crystal material, an electroluminescent (EL) film or the like, which is a large-capacity and high-density active matrix type display apparatus used for television or graphic display, has been developed for practical use. In such a display apparatus, a semiconductor switch for driving and controlling each pixel is used so as to perform high-contrast display without cross-talk. MOSFETs formed on a single crystalline Si substrate or TFTs formed on a transparent substrate which can perform transmission type display are used as such semiconductor switches.

FIGS. 1 and 2 show an equivalent circuit of an active matrix type display apparatus having a TFT array and a schematic sectional view thereof, respectively. In FIG. 1, reference numeral 11 denotes a TFT as a switching element; and 12 denoter a display pixel electrode which is connected to the source of the TFT 11 through a connecting portion 10. The connecting portion 10 is a small region which connects the source of the TFT 11 with the display pixel electrode 12 having a large area. The connecting portion 10 can be integrally formed with the display pixel electrode 12 and the source electrode of the TFT 11, or can be formed of a different conductive material. Gates of the TFTs 11 of each row are commonly connected to respective gate buses Y1, Y2, ..., Yn. Drains of the TFTs 11 of each column are commonly connected to respective drain buses X1, X2, ..., Xm. Reference numeral 13 denotes an opposing electrode; and 14, a liquid crystal layer. In FIG. 2, a first electrode substrate 15 comprises a transparent insulating substrate 16 formed of, e.g., glass on which the TFT array (not shown) and the display pixel electrode 12 driven thereby are formed. A second electrode substrate 17 comprises a transparent insulating substrate 18 formed of, e.g., glass on which the opposing electrode 13 formed of a transparent conductive film is formed. The liquid crystal layer 14 is sandwiched between these first and second electrode substrates 15 and 17. Reference numeral 19 denotes a spacer or sealing portion.

A specific structure of one pixel portion is as shown in FIGS. 3 and 4. FIG. 3 is a plan view showing a pattern of the first electrode substrate 15, and FIG. 4 is a detailed sectional view thereof. The first electrode substrate 15 can be obtained in the following manner. A drain electrode 20 formed of a transparent conductive film, the display pixel electrode 12 and a source electrode 21 integrally formed with the connecting portion 10 are formed on the transparent insulation substrate 16. A semiconductor thin film 22 is deposited on the thus obtained structure. Then, a gate electrode 24 formed of, e.g., an Al film is formed on the semiconductor thin film 22 through a gate insulating film 23. Thereafter, a passivating film 25 formed of, e.g., an SiO$_2$ film is formed on the resultant structure, thus obtaining the first electrode substrate 15.

In the above structure, the operation of the liquid crystal display apparatus is performed in the following manner. The gate buses Y1, Y2, ..., Yn are sequentially scanned and driven by a scanning signal. The TFTs 11 are sequentially turned on by each gate bus during a time period of T$_f$/n. Note that "T$_f$" here means a frame scanning period. When, for example, m parallel image signal voltages are applied to the drain buses X1, X2, ... Xm in synchronism with this scanning operation, the signal voltages are sequentially coupled to the display pixel electrodes 12 by each gate bus. Then, the signal voltage excites the liquid crystal layer 14 sandwiched between the display electrode 12 and the opposing electrode 13, thereby performing image display.

In this display apparatus, a TFT is easily subjected to light influence. Particularly, when a hydrogenated amorphous silicon film (a-Si:H) is used as a semiconductor film, conductivity becomes more than thousand times of that upon irradiation with light. When the TFT is turned off, therefore, a leakage current is increased, thereby degrading performance of a transmission type display apparatus. In order to compensate for this disadvantage, a light shielding layer must be provided on the TFT portion.

In addition, in this display apparatus, the signal voltage supplied through the TFT 11 and the connecting portion 10 is stored by a capacitor consisting of the display pixel electrode 12, the opposing electrode 13 and the liquid crystal layer 14. However, in many applications, since a leakage current flows in the liquid crystal layer 14, the stored signal voltage is attenuated before the TFT 11 is next driven. In order to prevent this disadvantage, a supplemental storage capacitor is connected in parallel to the capacitance of the liquid crystal layer 14. In this case, a capacitor electrode 26 formed of a transparent conductive film is formed on the transparent insulating substrate 16, as shown in FIG. 5. Then, an insulating film 27 formed of, e.g., an SiO$_2$ film is formed on the capacitor electrode 26. Thereafter, the TFT array and the display pixel electrode 12 are formed in the same manner as in FIG. 4.

However, when a light shielding layer and a capacitor electrode are separately provided as described above, the number of manufacturing steps is increased, thereby degrading a yield of the display apparatus.

SUMMARY OF THE INVENTION

It is an object of the present invention to provide an active matrix type display apparatus having high performance in which a high manufacturing yield can be obtained without increasing the number of manufacturing steps.

In an active matrix type display apparatus of the present invention, an electrically conductive light shielding layer is provided on a TFT portion of a first electrode substrate and is set at a predetermined potential, and a part thereof opposes a part of a display pixel electrode through an insulating film so as to form an supplemental storage capacitor.

According to the present invention, the TFT portion is covered by the light shielding layer, and the supplemental storage capacitor is formed between the light shielding layer and the display pixel electrode, thereby obtaining a transmission type display apparatus having a good resistance to ambient light and a high signal-voltage storing property. Furthermore, according to the present invention, since the light shielding layer also serves as the supplemental storage capacitor electrode, the manufacturing process does not become complicated and the number of steps is not increased, and therefore a high manufacturing yield can be obtained.

BRIEF DESCRIPTION OF THE DRAWINGS

FIGS. 6 and 7 are respectively views showing one pixel portion of an active matrix type display apparatus according to an embodiment of the present invention corresponding to FIGS. 3 and 4.

DETAILED DESCRIPTION OF THE PREFERRED EMBODIMENTS

An embodiment of the present invention will be described hereinafter.

Figure 1:
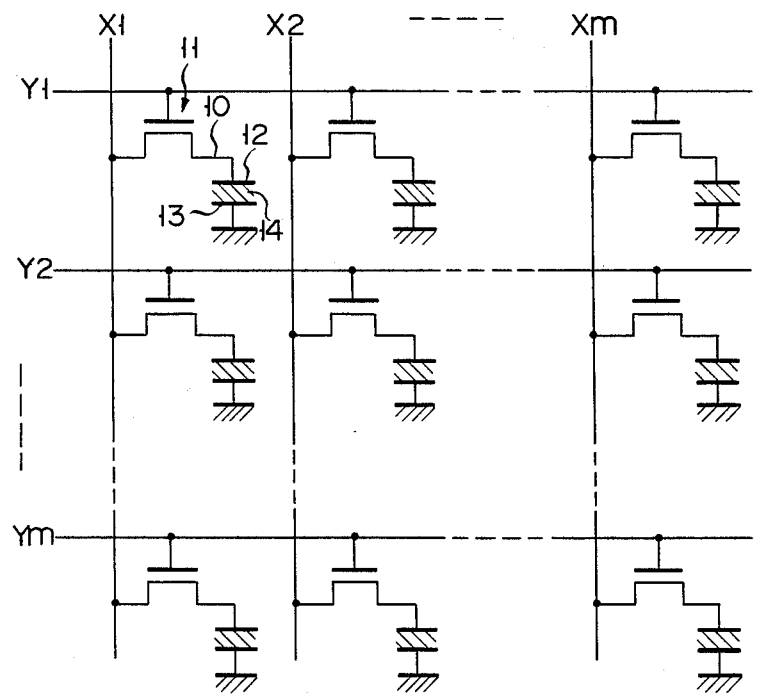
FIG. 1 is a circuit diagram showing an equivalent circuit of a conventional active matrix type display apparatus.
Figure 2:
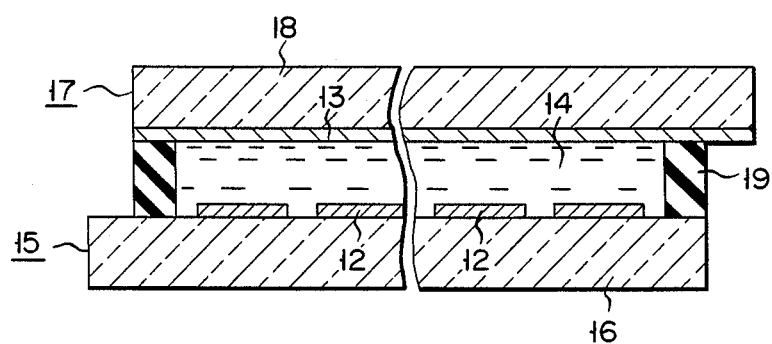
FIG. 2 is a schematic sectional view showing the entire structure of the conventional display apparatus of FIG. 1.
Figure 3:
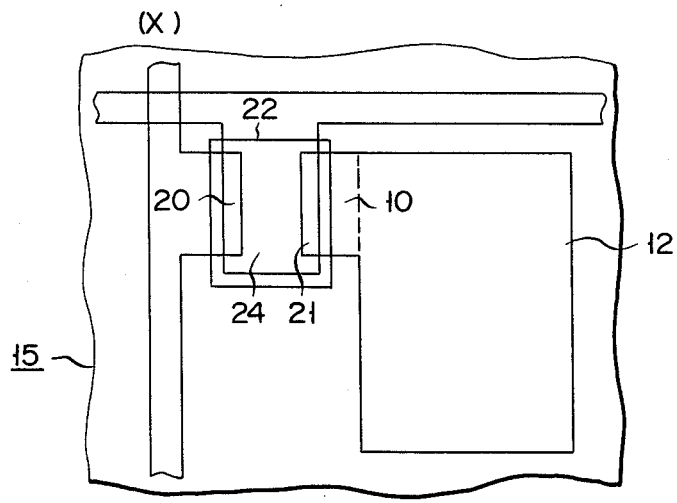
FIG. 3 is a plan view showing a pattern of one pixel portion of the conventional display apparatus of FIG. 1.
Figure 4:
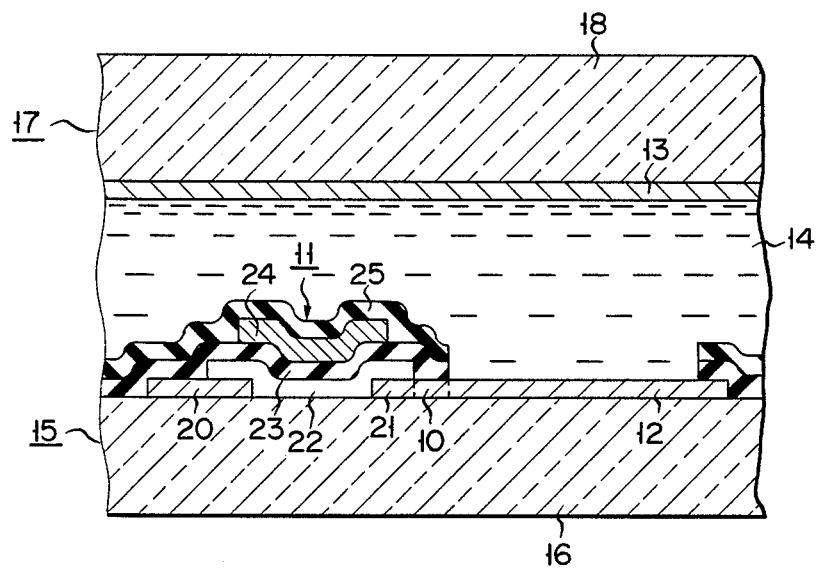
FIG. 4 is a sectional view of the one pixel portion of FIG. 3.
Figure 5:
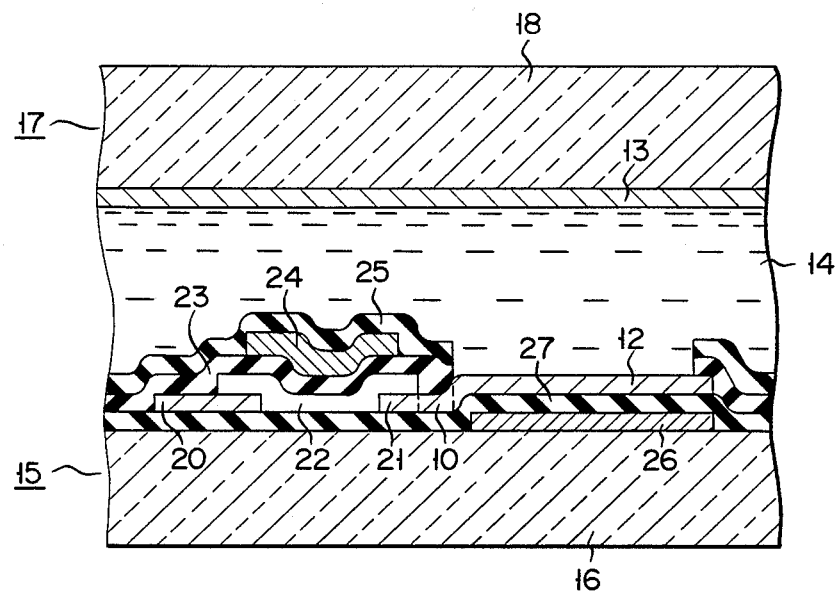
FIG. 5 is a sectional view showing the conventional active matrix type display apparatus having a supplemental storage capacitor corresponding to FIG. 4.
Figure 7:
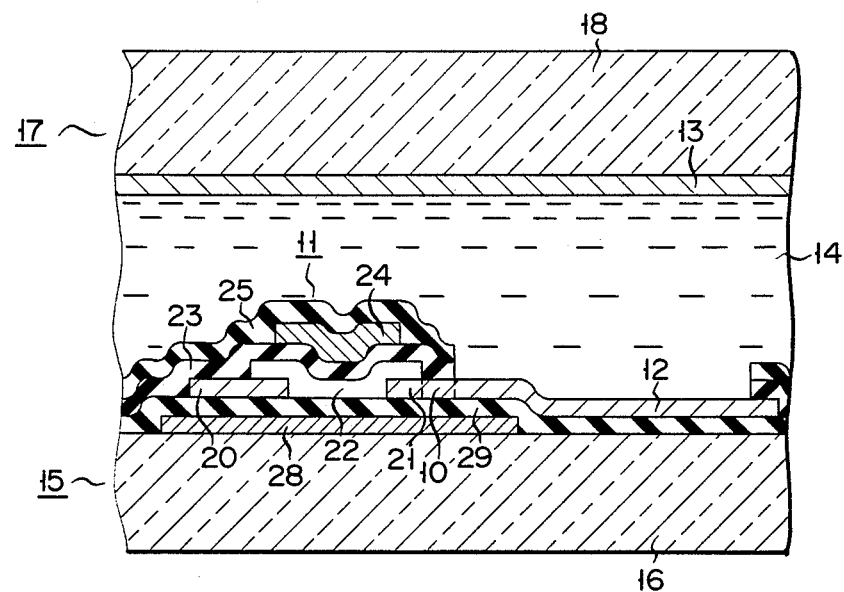

FIGS. 6 and 7 show a structure of one pixel portion according to this embodiment of the present invention corresponding to FIGS. 3 and 4, respectively. Therefore, the same reference numerals as in FIGS. 3 and 4 denote the same parts in FIGS. 6 and 7 and a detailed description thereof is omitted. The apparatus shown in FIGS. 6 and 7 is different from the conventional apparatus in that an electrically conductive light shielding layer 28 is formed on a transparent insulating substrate 16 so as to cover a TFT region before forming a TFT 11, a display pixel electrode 12 and a connecting portion 10. This light shielding layer 28 comprises a metal film formed of, e.g., Al, Mo or Cr. A silicon nitride film 29 serving as an insulating film is formed on the light shielding layer 28, and the TFT 11 and the display pixel electrode 12 are formed thereon. It should be noted that each light shielding layer 28 is commonly provided along a column direction and is set at a predetermined potential such as a ground potential by an external circuit. This is because, if not, a drain electrode of the TFT 11 causes capacitive coupling with a source electrode 21 through the light shielding layer 28. However, the predetermined potential is not limited to the ground potential. In addtion, if the light shielding layer 28 opposes the entire surface of the display pixel electrode 12, transmission display cannot be performed. For this reason, the light shielding layer 28 is formed to overlap a part of the display pixel electrode 12, and this overlapped portion forms the supplemental storage capacitor. In this embodiment, the connecting portion 10 also forms a capacitor with the light shielding layer 28 and forms a portion of the supplemental storage capacitor.

The effect of the thus formed supplemental storage capacitor using the light shielding layer 28 will now be described in detail.

A capacitance $C_1$ of this supplemental storage capacitor can be determined by a permittivity and a thickness of the silicon nitride film 29 and an overlapped area of the light shielding layer 28, the display pixel electrode 12 and the connecting portion 10. A capacitance $C_1 = 0.5 - 1$ pF can easily be obtained by an overlapped area which is not so large as to practically affect light transmission at the display pixel portion. When a size of the display pixel electrode 12 was given by 165 $\mu m \times 150$ $\mu m$ and a width L of the overlapped portion was given by 15 $\mu m$, the capacitance $C_1$ was 0.85 pF. A capacitance formed in the overlapped portion of the connecting portion 10 and the light shielding layer 28 was in the order of 0.01 pF and contribution to the supplemental storage capacitor was extremely small.

On the other hand, the display pixel electrode 12, the opposing electrode 13 and the liquid crystal layer 14 formed therebetween serve as a signal voltage storing capacitor. In the case wherein a pixel area S is 150 $\mu m \times 150$ $\mu m$, a dielectric constant $\epsilon$ of a liquid crystal material is 8, and a thickness t of a cell is 8 $\mu m$, a capacitance $C_2$ of this capacitor is about 0.2 pF. When a resistivity of a liquid crystal material is given by a typical value of a guest-host type liquid crystal of $\rho_{LC} = 2 \times 10^{10}$ $\Omega \cdot cm$, a resistance of the liquid crystal layer 14 is expressed by;

$$\gamma_{LC} = 2 \times 10^{10} \times \{(8 \times 10^{-4})/(150 \times 10^{-4})^2\}$$
$$= 7.1 \times 10^{10} \, \Omega$$

Therefore, if a signal voltage is held by only the capacitance $C_2$, a time constant $\tau$ becomes $C_2 \gamma_{LC} = 14$ ms and a display electrode potential is attenuated at $V_0$ exp $(-t/\tau)$ where $V_0$ is the signal voltage initially stored in the display electrode. When one-line-at-a-time scheme driven display having a frame frequency of 60 Hz is performed, the time from an excitation of one line to the next excitation takes about 17 msec. In this case, when only the capacitance $C_2$ is used, a display electrode potential drops to $\frac{1}{3}$ or less of the initial potential $V_0$, thereby undesirably decreasing an effective voltage applied to the liquid crystal layer and degrading the performance of the LCD. However, in this embodiment, since a parallel supplemental storage capacitor having a capacitance $C_1 = 0.9$ pF is provided, a display electrode potential after one period is kept at 72% of the initial potential, and an effective voltage applied to the liquid crystal layer is considerably increased. Therefore, high-performance display can be obtained by the increase of the effective voltage and a light-shielding effect.

Furthermore, in this embodiment, since the light shielding layer serves as the supplemental storage capacitor, the manufacturing process does not become complicated and the number of steps is not increased, thereby improving a yield.

Figure 8:
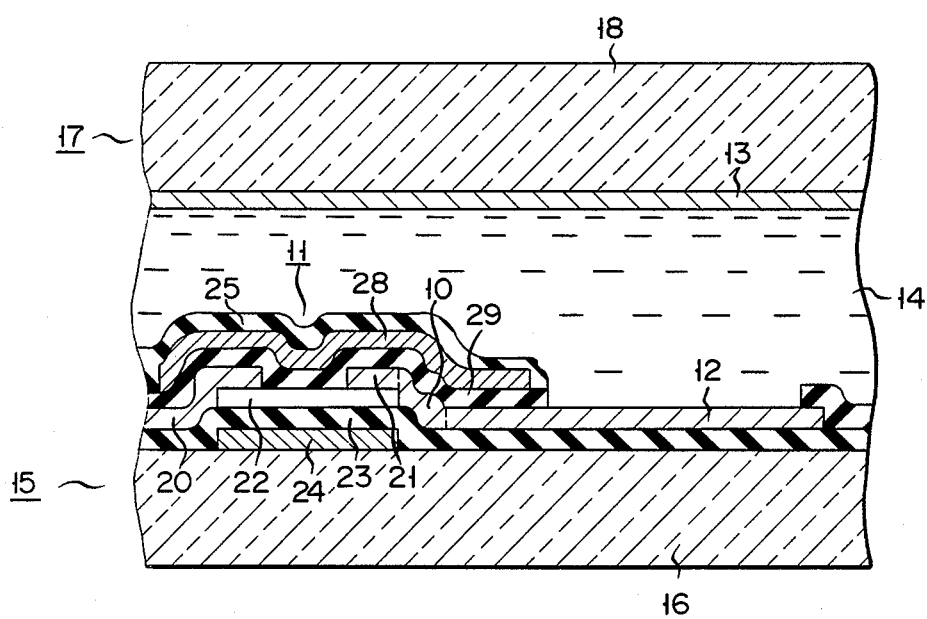
FIG. 8 is a view showing a structure of one pixel portion according to another embodiment of the present invention corresponding to FIG. 7.

FIG. 8 is a sectional view of one pixel portion according to another embodiment of the present invention corresponding to FIG. 7. A TFT 11 has a vertically inverted structure of that of the above embodiment. The same reference numerals as in FIG. 7 denote the same parts in FIG. 8. In this embodiment, a gate electrode 24 of the TFT 11 is directly formed on a transparent insulating substrate 16. Since incidence of light from a side of a second electrode substrate 17 causes a problem, a light shielding layer 28 is formed on the TFT 11 and a display pixel electrode 12. The light shielding layer 28 overlaps with a part of the display pixel electrode 12 and a connecting portion 10 through a silicon nitride film 29, thereby constructing a supplemental storage capacitor in the same manner as in the above embodiment. The same effect as in the above embodiment can be obtained from this embodiment.

The present invention can be effectively adopted not only in an apparatus using poly-Si or a-Si:H, but also in an apparatus using poly-Si or a compound semiconductor such as, CdSe or CdS. A gate insulating film and an insulation film between a light shielding layer and a display pixel electrode are not limited to a silicon oxide film and silicon nitride film, but can be formed of an inorganic insulation film such as a silicon oxynitride film, or of an organic insulation film of, for example, polyimide. Furthermore, a light shielding layer can be formed of any conductive material which do not transmit light therethrough. In addition, since almost no current flows therein, this layer can be formed of a material having a relatively high resistance and can be a thin film of 1,000 Å to 2,000 Å. Each of the above-mentioned layers can be formed by plasma CVD, normal pressure or low pressure CVD, deposition, sputtering, molecular beam epitaxy, spin-on glass, or the like. Furthermore, although a transparent electrode is directly formed as an opposing electrode on a transparent substrate in the above embodiments, the transparent electrode can be formed on a color filter formed on an insulating substrate, or the color filter can be provided after forming the transparent electrode.

Although a liquid crystal display apparatus has been described in the above embodiments, the present invention can be effectively applied to a display apparatus using an EL thin film instead of a liquid crystal material.

What is claimed is:

1. An active matrix type display apparatus, comprising:
   a first transparent insulation substrate;
   electrically conductive light shielding layer means maintained at a predetermined potential and formed on said first transparent substrate for shielding against light;
   a first insulation film, deposited on said light shielding layer means;
   a thin film transistor formed above and insulated from said light shielding layer means on said first insulation film, including: (1) a semiconductor thin film, (2) a source electrode insulated from said light shielding layer means, (3) a drain electrode insulated from said light shielding layer means, (4) a gate insulating film disposed on said semiconductor thin film, and (5) a gate electrode insulated from said light shielding layer means and made of an opaque material disposed on said gate insulating film, said light shielding layer opposing said gate electrode with said semiconductor thin film therebetween;
   a transparent display pixel electrode on said first transparent insulating substrate which is selectively addressed by said thin film transistor, a part of said light shielding layer means overlapping a part of said transparent display pixel electrode with said first insulation film therebetween to form an overlapping portion, wherein said light shielding layer means is also for forming a supplemental storage capacitor with said display pixel electrode at said overlapping portion;
   a connecting portion on said thin first transparent insulation substrate for connecting said thin film transistor with said transparent display pixel electrode;
   a drain bus formed on said insulating film and connected to said drain electrode;
   a gate bus formed on said gate insulating film and connected to said gate electrode, said light shielding layer means not being connected to said drain bus and said gate bus;
   a second transparent insulating substrate;
   an opposing electrode formed on said second transparent insulating substrate formed of a transparent conductive film; and
   a display liquid crystal medium, disposed between said first and second transparent insulation substrates and forming a signal voltage storage capacitor with said transparent display pixel electrode and said opposing electrode.

2. An apparatus according to claim 1, wherein said light shielding layer is formed of a metal selected from the group consisting of Al, Mo and Cr.

3. An apparatus according to claim 1, wherein said gate electrode is formed of aluminum.

4. An apparatus according to claim 1, wherein said display medium is a liquid crystal material.

5. An active matrix display apparatus, comprising:
   a first transparent insulation substrate;
   a thin film transistor formed on said first transparent insulation substrate and including a gate electrode made of an opaque material, a gate insulating film disposed on said gate electrode, a semiconductor thin film disposed on said gate insulating film, and source and drain electrodes;
   a transparent display pixel electrode disposed on said first transparent insulation substrate coupled to said thin film transistor to be selectively addressed by said thin film transistor;
   a gate thus formed on said first transparent insulation substrate and connected to said gate electrode;
   a drain bus formed on said gate insulating film and connected to said drain electrode;
   a connecting portion on said first transparent insulation substrate for connecting said thin film transistor with said transparent display electrode;
   a second transparent insulation substrate;
   an opposing electrode formed on said second transparent insulating substrate and formed of a transparent conductive film;
   a liquid crystal medium disposed between said first and second transparent insulation substrates and forming a signal voltage storing capacitor with said transparent display pixel electrode and said opposing electrode;
   an insulation film, formed on said thin film transistor; and
   electrically conductive light shielding layer means for shielding against light penetration, maintained at a predetermined potential and formed over and insulating from said thin film transistor on said insulation film to oppose said gate electrode through said semiconductor thin film, with said light shielding layer means not being connected to and being insulated from said gate bus, said drain bus and said source electrode, and a part of said light shielding layer means opposing a part of said display pixel electrode with said insulation film therebetween, for forming a supplemental storage capacitor.

6. An apparatus according to claim 5, wherein said light shielding layer is formed of the metal selected from the group consisting of Al, Mo and Cr.

7. An apparatus according to claim 5, wherein said gate electrode is formed of aluminum.

8. An active matrix type display apparatus comprising:

a first transparent insulating substrate;

gate buses formed on said first transparent insulating substrate, said gate buses being sequentially scanned and driven by a scanning signal;

drain buses formed on said first transparent insulating substrate and having parallel image signal voltages applied thereto;

a thin film transistor array formed on said first transparent insulating substrate, said thin film transistor array having a plurality of thin film transistors including a semiconductor thin film, a source electrode, a drain electrode, a gate electrode and an insulating thin film between said gate electrode and said semiconductor thin film;

transparent display pixel electrodes formed on said first transparent insulating substrate, each of said pixel electrodes being selectively addressed by said thin film transistor array;

a second transparent insulating substrate;

a counter electrode formed on said second transparent electrode and made of transparent conductive film;

a liquid crystal medium disposed between said first and second transparent insulating substrates and forming a signal voltage storing capacitor with said transparent display pixel electrode and said counter electrode; and an electrically conductive light shielding layer fixed at a predetermined potential, said conductive light shielding layer not being in contact with and being insulated from said thin film transistor and overlapping a part of said transparent display pixel electrode through an insulating film so as to form a supplemental storage capacitor layer, said light shielding layer not being connected to and being insulated from said gate buses, said drain buses and said source electrode, said light shielding layer and said gate electrode sandwiching said semiconductor thin film.

* * * * *